United States Patent
Muramatsu

(12) 
(10) Patent No.: US 6,373,716 B1
(45) Date of Patent: Apr. 16, 2002

(54) PRINTED CIRCUIT BOARD FOR SURFACE CONNECTION AND ELECTRONIC APPARATUS EMPLOYING THE SAME

(75) Inventor: Yasuhiro Muramatsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/537,429

(22) Filed: Mar. 27, 2000

(30) Foreign Application Priority Data

Jul. 7, 1999 (JP) .......................................... 11-192521

(51) Int. Cl.[7] ................................................ H05K 1/11
(52) U.S. Cl. ........................ 361/784; 361/803; 361/790; 439/74; 174/255
(58) Field of Search ................................ 361/784, 803, 361/767, 792, 793, 776, 769, 787, 790; 174/254, 255; 439/91, 74

(56) References Cited

U.S. PATENT DOCUMENTS

| | | | |
|---|---|---|---|
| 5,008,496 A | * 4/1991 | Schmidt et al. | 174/254 |
| 5,343,358 A | * 8/1994 | Hilbrink | 361/700 |
| 5,434,362 A | * 7/1995 | Klosowiak et al. | 174/254 |
| 5,717,556 A | * 2/1998 | Yanagida | 361/803 |
| 5,746,813 A | * 5/1998 | Ishido et al. | 106/14.16 |
| 5,779,492 A | * 7/1998 | Okuyama et al. | 439/179 |
| 5,847,783 A | * 12/1998 | Hiramoto et al. | 439/69 |
| 5,925,931 A | * 7/1999 | Yamamoto | 257/737 |

FOREIGN PATENT DOCUMENTS

| | | |
|---|---|---|
| JP | 3007145 | 11/1994 |
| JP | 8-22872 | 1/1996 |
| JP | 10-181265 | 7/1998 |

\* cited by examiner

*Primary Examiner*—Jeffrey Gaffin
*Assistant Examiner*—Hung Bui
(74) *Attorney, Agent, or Firm*—Armstrong, Westerman & Hattori, LLP

(57) ABSTRACT

An electronic apparatus comprises a first and a second printed circuit board. An elastic conductive member is interposed between the first and second printed circuit boards. The elastic conductive member is employed to establish an electric connection between the first and second printed circuit boards in place of, for example, a prior art connector comprising a plug and a receptacle component. The elastic conductive member may comprise a plurality of brass wires penetrating through an elastic insulation plate made of silicon. The wires are designed to establish signal channels between the first and second printed circuit boards. Since the brass wires can be made short, the space between the first and second printed circuit boards can be suppressed even when the elastic conductive member is interposed between the first and second printed circuit boards. Accordingly, an electric connection can be established between a pair of printed circuit boards in a smaller space.

8 Claims, 6 Drawing Sheets

PRINTED CIRCUIT BOARD FOR SURFACE CONNECTION AND ELECTRONIC APPARATUS EMPLOYING THE SAME

BACKGROUND OF THE INVENTION

1. Field of the Invention

The present invention relates to surface connection for establishing an electric connection between a pair of printed circuit boards.

2. Description of the Prior Art

A multilayered printed circuit board is well known, which comprises layers of wiring patterns embedded in a substrate. Such a printed circuit board usually allows only input/output contact pads to expose at the surface of the substrate. On the other hand, a wiring pattern cannot be embedded in a substrate of some printed circuit boards such as flexible printed circuit boards, since such printed circuit boards cannot contain a large number of layers. A wiring pattern should be exposed at the surface of the substrate. The wiring pattern is covered with a protection film on the surface of the substrate.

In general, a connector is employed when an electric connection is to be established between the flexible printed circuit board and other circuit boards. Such a connector comprises a plug component mounted on either of the boards and a receptacle component mounted on the other of the boards. When the plug component is received in the receptacle component, a contact pin on the plug component enters a contact socket on the receptacle component. Electric connection can be established between the contact pin and socket. Combinations of pins and sockets are allowed to provide a large number of signal channels in a single connector.

The contact pins and sockets are supported in housings of synthetic resin material, respectively. The housings serve to electrically insulate the adjacent contact pins and sockets from each other. However, such housings are supposed to hinder reduction in size of the plug and receptacle components.

SUMMARY OF THE INVENTION

It is accordingly an object of the present invention to provide a connecting mechanism capable of establishing an electric connection between a pair of printed circuit boards in a smaller space.

According to the present invention, there is provided an electronic apparatus comprising: a first and a second printed circuit board; a conductive pattern formed on a surface of a substrate in at least one of the first and second printed circuit boards; a protection film formed on the substrate so as to cover over at least partly the conductive pattern; and an elastic conductive member interposed between the first and second printed circuit boards.

With this structure, the elastic conductive member is employed to establish an electric connection between the first and second printed circuit boards in place of, for example, a prior art connector comprising a plug and a receptacle component. The elastic conductive member may comprise a plurality of brass wires penetrating through an elastic insulation plate made of silicon. The wires are designed to establish signal channels between the first and second printed circuit boards. Since the brass wires can be made short, the space between the first and second printed circuit boards can be suppressed even when the elastic conductive member is interposed between the first and second printed circuit boards. Accordingly, an electric connection can be established between a pair of printed circuit boards in a smaller space.

In order to realize the aforementioned electronic apparatus, a printed circuit board may comprise: a substrate; a conductive pattern formed on a surface of the substrate; a protection film formed on the substrate so as to cover over at least partly the conductive pattern; and a conductive contact protruding from a surface of the conductive pattern so as to reach a level above a surface of the protection film.

For example, a conventional anisotropic conductive rubber plate may comprise a plurality of brass wires uniformly arranged over the entire area of an elastic insulation plate. When the anisotropic conductive rubber plate has been interposed between a pair of printed circuit boards, the brass wires are arranged not only at a location aligned with the contact pads for establishing signal channels in the conductive pattern but also at a location off the contact pads. If the protection film covers over the conductive pattern off the contact pads, the brass wires cannot reach the contact pads because the brass wires off the contact pads first contact the protection film so as to hinder the brass wires from approaching the contact pads. An electric connection cannot be established between the brass wires and the contact pads.

On the other hand, the electronic apparatus of the present invention may employ a conductive contact protruding from a surface of the conductive pattern so as to reach a level above a surface of the protection film. The conductive contact in this manner is adapted to allow the brass wires to first contact the conductive contact when the anisotropic conductive rubber plate is superposed on the printed circuit board. The protection film surely fails hinder establishment of signal channels leading from the conductive pattern to the brass wires. Such conductive contact may comprise a contact pad shaped in the conductive pattern, and a solder bump formed on a surface of the contact pad. Otherwise, the conductive contact may be integrated with the conductive pattern.

In order to realize the aforementioned electronic apparatus, an elastic conductive member may comprise: an elastic insulation plate defining through holes; and a conductive pin selectively received in the through hole. This type of elastic conductive member allows the conductive pin to be selectively arranged only at location aligned with the conductive pattern exposed at the breaks of the protection film. Such conductive pin is allowed to first contact the conductive pattern without inducing collision against the protection film when the elastic conductive member is superposed on the surface of the printed circuit board. The elastic conductive member serves to reliably establish a signal channel leading from the conductive pattern to the conductive pin.

The elastic conductive member may employ an insulation plate defining an operative through hole only for receiving the conductive pin. Otherwise, an insulation plate may define, in addition to the operative through hole, an additional or inoperative through hole of a diameter identical to that of the operative through hole. Employment of such an inoperative through hole is designed to allow the conductive pin to be relocated from the operative through hole to the inoperative through hole. Accordingly, the elastic conductive member is allowed to easily change the pattern of electric connection between a pair of printed circuit boards. The through holes uniformly arranged in a larger area enable any combination of the operative through holes, so that the elastic conductive member is allowed to deal with the contact pads in various arrangement without redesigning the insulation plate and the conductive pin. In producing the insulation plate, it is not necessary to distinct the operative and inoperative through holes from each other, since the operative and inoperative through holes have the same dimension.

The present invention may be applied to any types of printed circuit boards assembled within an electronic apparatus such as a computer hardware, a PDA (personal digital assistant), and the like.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
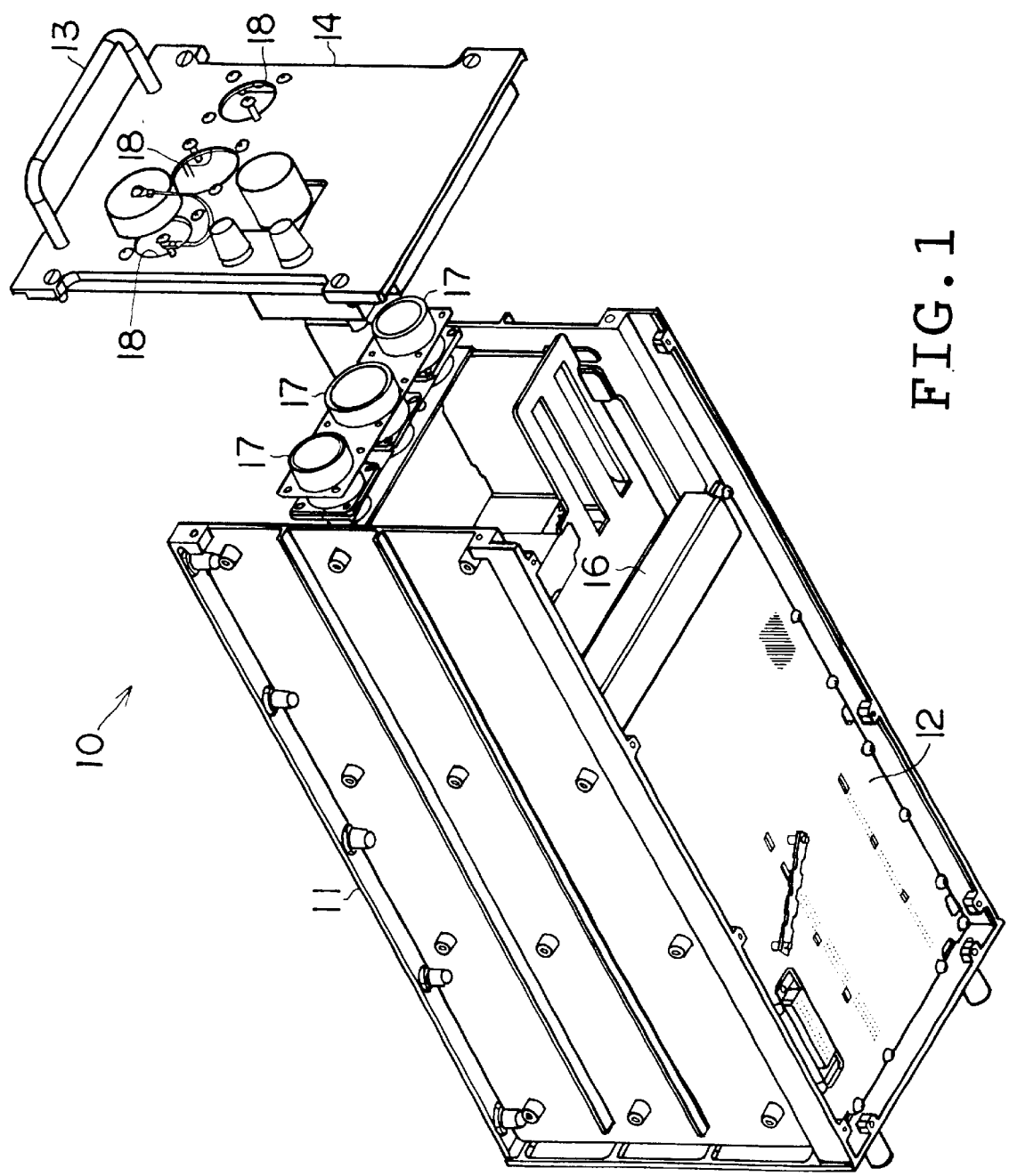
FIG. 1 is a partially exploded perspective view illustrating a small-sized computer unit.

FIG. 1 schematically illustrates a small-sized computer unit. The small-sized computer unit 10 comprises a box-shaped enclosure 11 and a back panel 12 as a first printed circuit board. The back panel 12 functions as a bottom plate of the enclosure 11. The front opening of the enclosure 11 is closed with a front panel 14. A handle 13 may be attached to the front panel 14.

Connectors, not shown, are mounted on the surface of the back panel 12 so as to receive circuit boards upright to the surface of the back panel 12. The circuit boards may include a CPU (central processing unit) board on which a CPU of the computer unit 10 is mounted, a memory board on which memory units are mounted, and the like. The circuit boards received in the connectors are housed within the enclosure 11. Any electronic parts, in addition to the connectors, may be mounted on the opposite surfaces of the back panel 12.

The end of a flexible printed circuit board 16, as a second printed circuit board, is connected to the back panel 12 through a connecting mechanism according to the present invention. Receptacle components 17 of so-called MS connectors are connected to the other end of the flexible printed circuit board 16, for example. When the front panel 14 is coupled to the enclosure 11, the receptacle components 17 of the MS connectors protrude forward of the front panel 14 out of openings 18, respectively, formed in the front panel 14.

The protruding receptacle components 17 are designed to receive plug components, not shown, of the MS connectors.

Figure 2:
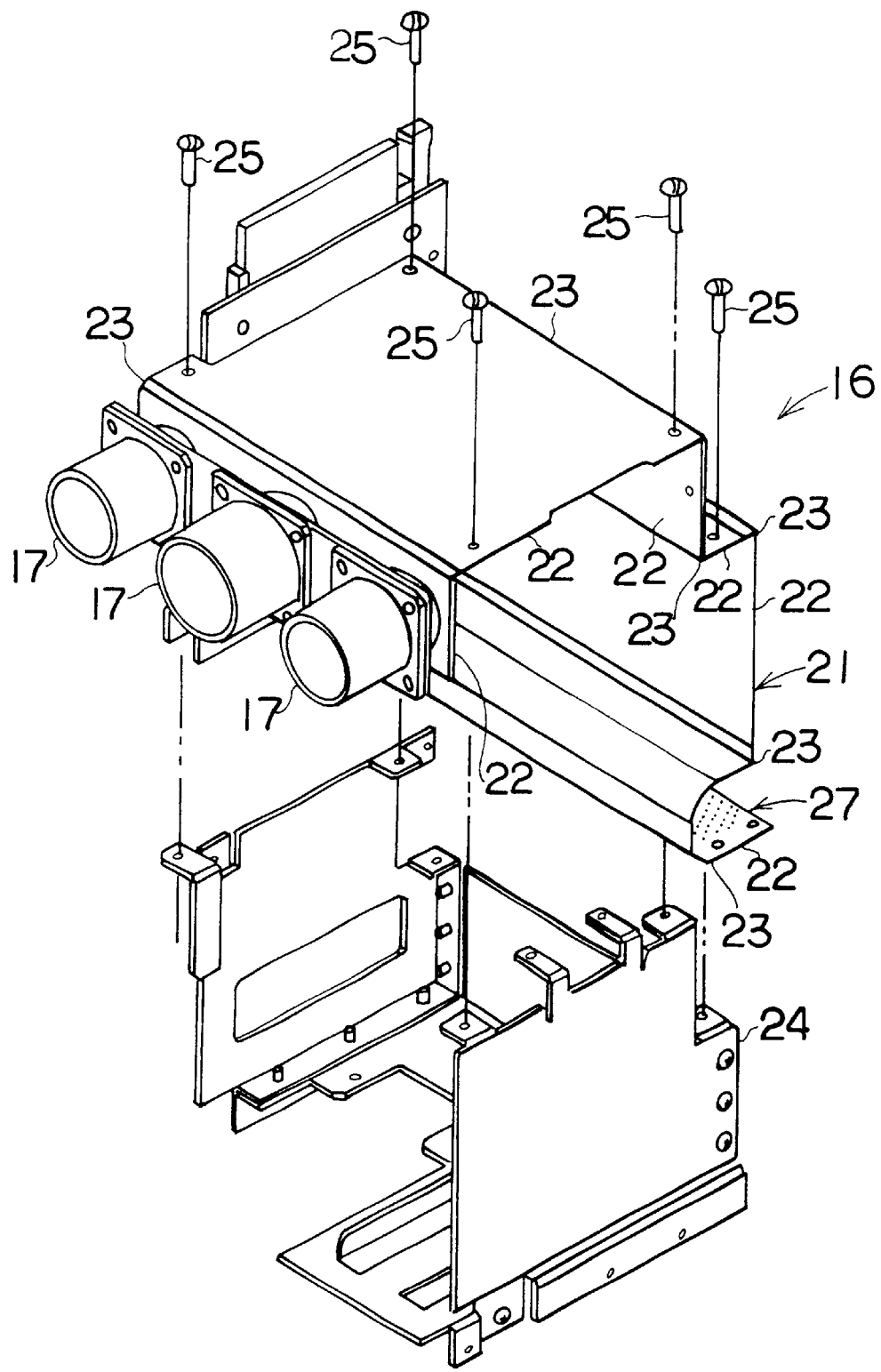
FIG. 2 is an enlarged perspective view illustrating a flexible painted circuit board combined with a support member.

As shown in FIG. 2, the flexible printed circuit board 16 comprises a flexible substrate 21 on which the receptacle components 17 of the MS connectors are mounted. The flexible substrate 21 may be made from a synthetic resin material. At least six rigid backing plate members 22 are adhered to the flexible substrate 21, for example. Each of the backing plate members 22 may be superposed on either of the opposite surfaces of the flexible substrate 21. The backing plate members 22 are designed to back and support corresponding sections of the flexible substrate 21. The respective backing plate members 22 are adapted to prevent deformation of the corresponding sections. Parallel six folds 23 serve to define the sections on the flexible substrate 21. The substrate 21 backed by the backing plate members 22 is combined with a metallic support member 24 after being bent at the folds 23. For example, screws 25 may be employed to fix the flexible substrate 21 to the support member 24. The flexible printed circuit board 16 fixed to the support member 24 is finally assembled into the enclosure 11.

Figure 3:
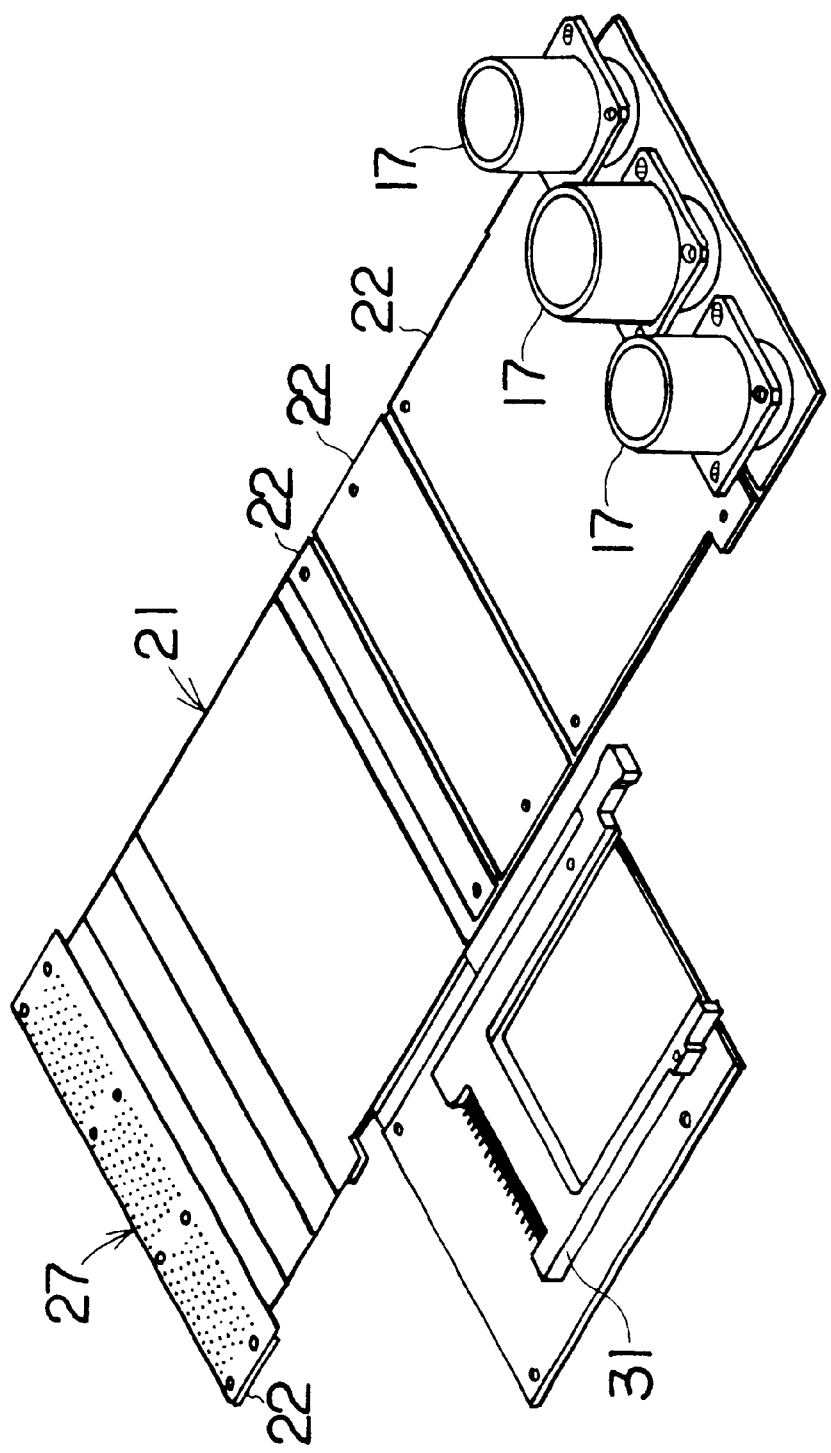
FIG. 3 is an exploded view illustrating the flexible printed circuit board.

FIG. 3 schematically illustrates the exploded view of the substrate 21. A conductive pattern 27 is printed on the surface of the flexible substrate 21 at an end of the flexible substrate 21. The conductive pattern 27 is designed to realize the connecting mechanism according to the present invention, namely, a surface connection. The conductive pattern 27 is electrically connected to the receptacle components 17 at the other end of the flexible substrate 21 through a printed wiring pattern, not shown, extending between the opposite longitudinal ends of the flexible substrate 21. When electric connection is established between the conductive pattern 27 and the back panel 12 through the surface connection, the receptacle components 17 are allowed to exchange electric signals with the back panel 12 through the conductive pattern 27 and the printed wiring pattern.

Figure 4:
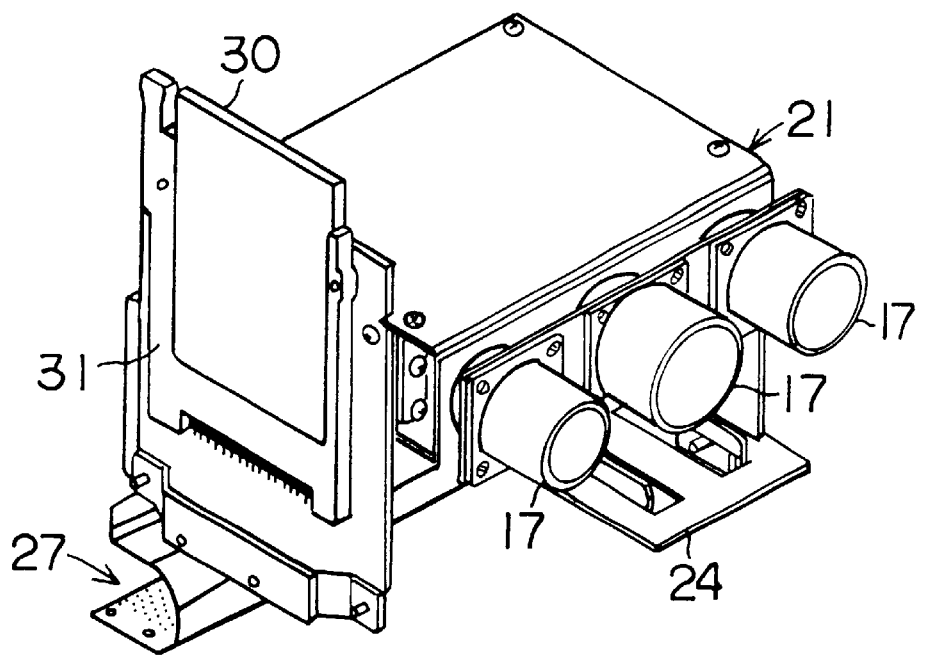
FIG. 4 is a perspective view schematically illustrating a card slot mounted on the flexible printed circuit board.

Referring also to FIG. 4, a card slot or connector 31 may be attached to the flexible substrate 21 for receiving a memory card 30 such as a flash memory card. The card slot 31 may be mounted on the surface of the flexible substrate 21. Electric connection is likewise established between the card slot 31 and the back panel 12 through the conductive pattern 27 and the printed wiring pattern. In this manner, any electronic parts may be, in addition to the aforementioned MS connectors and card slot, mounted on the flexible substrate 21. On the contrary, no electronic parts may be mounted on the flexible substrate while allowing only printed wiring pattern to spread over the surface of the flexible substrate 21.

Figure 5:
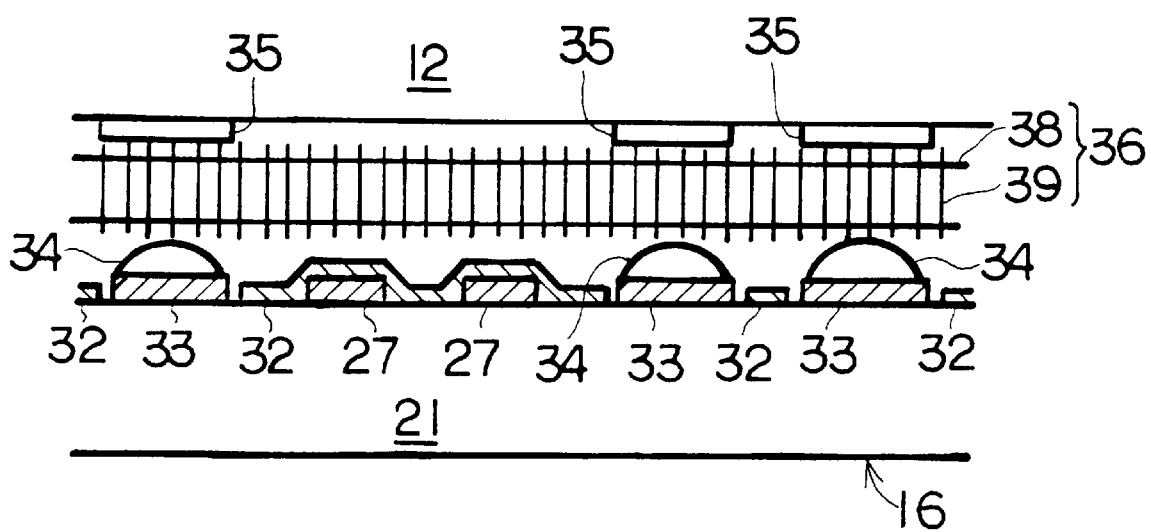
FIG. 5 is an enlarged sectional view schematically illustrating a connecting mechanism according to the present invention.

As shown in FIG. 5, protection film pattern 32 is formed, at least partly, on the surface of the conductive pattern 27. The protection film pattern 32 is adapted to cover over not only the conductive pattern 27 but also the surface of the flexible substrate 21. For example, a cured photoresist film may result in the protection film pattern 32. In addition, the protection film pattern 32 also covers over the printed wiring pattern connecting the conductive pattern 27 to the receptacle components 17. The conductive pattern 27 and the printed wiring pattern covered with the protection film pattern 32 is reliably prevented from corrosion and oxidation.

As shown in FIG. 5, the conductive pattern 27 comprises contact pads 33 formed on the surface of the flexible substrate 21. The aforementioned protection film pattern 32 is not designed to cover over the contact pads 33. The contact pads 33 is adapted to keep exposed on the surface of the flexible substrate 21. Solder bumps 34 are formed on the respective contact pads 33 so as to provide a conductive contact of the present invention. The solder bumps 34 are designed to protrude from the surface of the conductive pattern 27, namely, the contact pads 33 so as to reach a level above the surface of the protection film pattern 32.

Figure 6:
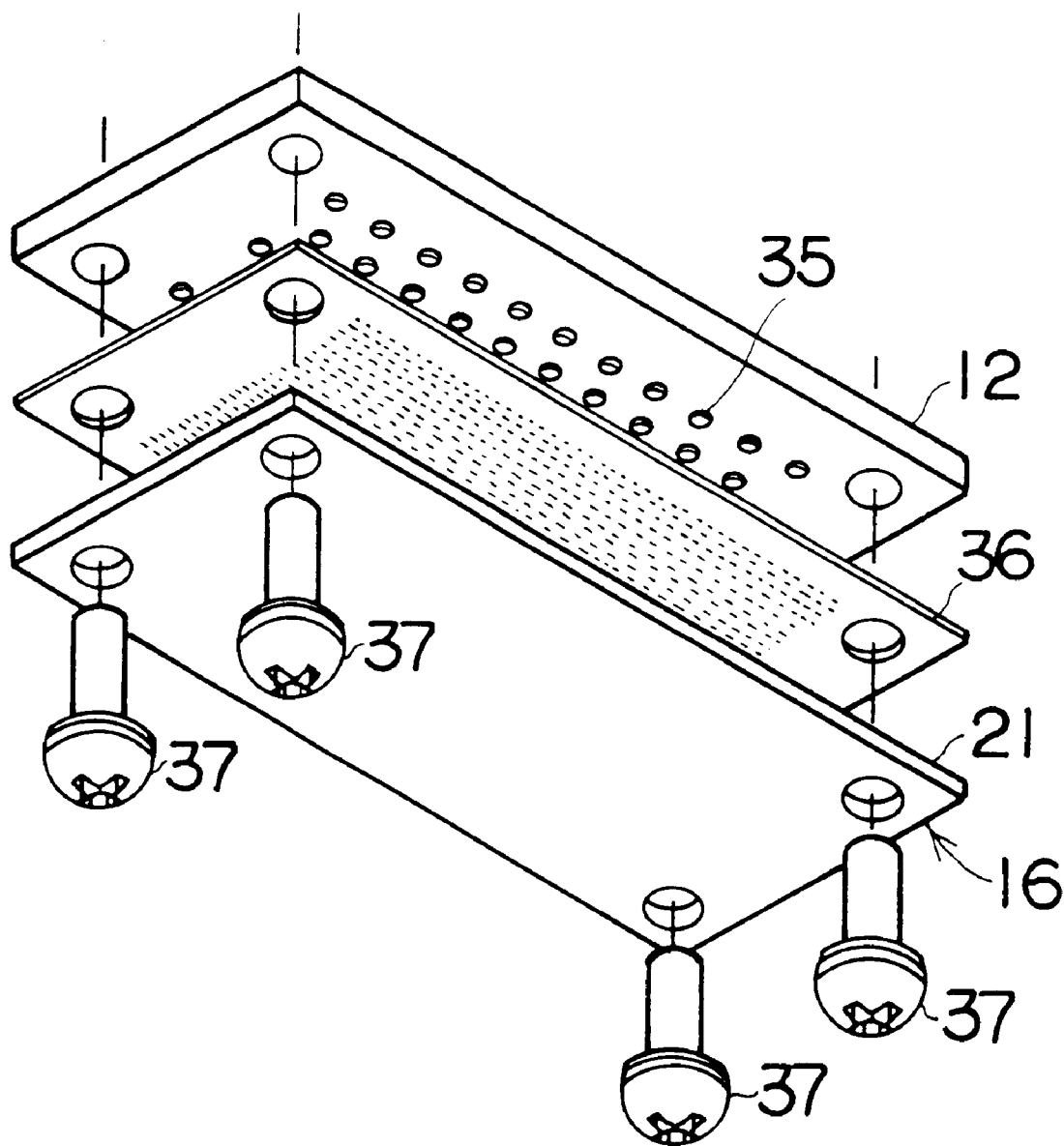
FIG. 6 is a perspective view schematically illustrating the assembly process of the connecting mechanism.

For example, assume that an anisotropic conductive rubber plate 36 and the aforementioned flexible printed circuit board 16 are sequentially superposed on the surface of the back panel 12, as shown in FIG. 6. A plurality of conductive contact pads 35 are arranged on the surface of the back panel 12. When the superposed anisotropic conductive rubber plate 36 and flexible printed circuit board 16 are fixed by screws 37 on the back panel 12, the assembly of a connecting mechanism is completed according to the present invention.

The anisotropic conductive rubber plate 36 as an elastic conductive member comprises, for example, an elastic insulation plate 38 made of silicon, and a plurality of brass wires 39 embedded in the elastic insulation plate 38, as shown in FIG. 5. The respective brass wires 39 are designed to penetrate through the elastic insulation plate 38. The opposite ends of the brass wire 39 are adapted to protrude from the opposite surfaces of the elastic insulation plate 38. When the opposite ends of the brass wire 39 contact the conductive contact pad 35 on the surface of the back panel 12 and the solder bump 34 on the corresponding contact pad 33 on the flexible printed circuit board 16, electric connection is established between the contact pads 33, 35. Since the length of the respective brass wires 39 can relatively be reduced, the space can be reduced between the back panel 12 and the flexible printed circuit board 16. Accordingly, electric connection can be established between the back panel 12 and the flexible printed circuit board 16 in a smaller space.

As described above, the top ends of the solder bumps 34 on the contact pads 33 are designed to reach the level above the protection film pattern 32 in the area of the conductive layer 27. Accordingly, the connecting mechanism in the above manner allows the brass wires 39 to first contact the corresponding solder bumps 34 on the contact pads 33 when the anisotropic conductive rubber plate 36 is superposed on the flexible printed circuit board 16. The brass wires 39 are reliably prevented from collision against the protection film pattern 32. Signal channels are surely established to lead from the contact pads 33 to the brass wires 39. Without the solder bumps 34, the brass wires 39 first collide against the protection film pattern 32 at locations off the contact pads 33, 35, since the brass wires 39 are uniformly arranged in the elastic insulation plate 38 over a broader area. No solder bumps 34 may result in the brass wires 39 spaced apart from the contact pads 33 even when the anisotropic conductive rubber plate 36 is superposed on the conductive pattern 27, so that no electric connection is established between the contact pads 33, 35.

Figure 7:
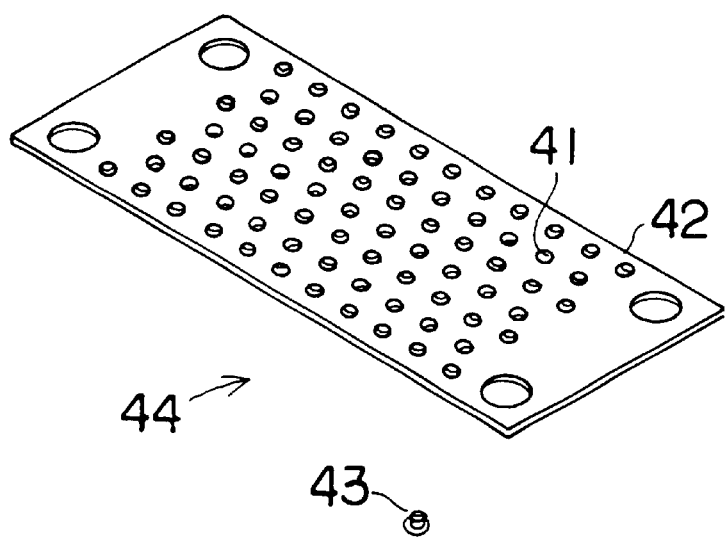
FIG. 7 is a perspective view schematically illustrating an anisotropic conductive rubber plate according to another specific embodiment.

The aforementioned connecting mechanism may employ an anisotropic conductive rubber plate 44 of the type as shown in FIG. 7 in place of the aforementioned anisotropic conductive rubber plate 36. The anisotropic conductive rubber plate 44 as an elastic conductive member comprises an elastic insulation plate 42 having a plurality of through holes 41, and one or more detachable conductive pins 43 selectively received in the through holes 41. The opposite longitudinal ends of the through hole 41 are designed to open at the opposite surfaces of the elastic insulation plate 42. The through holes 41 may be arranged regularly and uniformly all over the entire elastic insulation plate 42.

Figure 8:
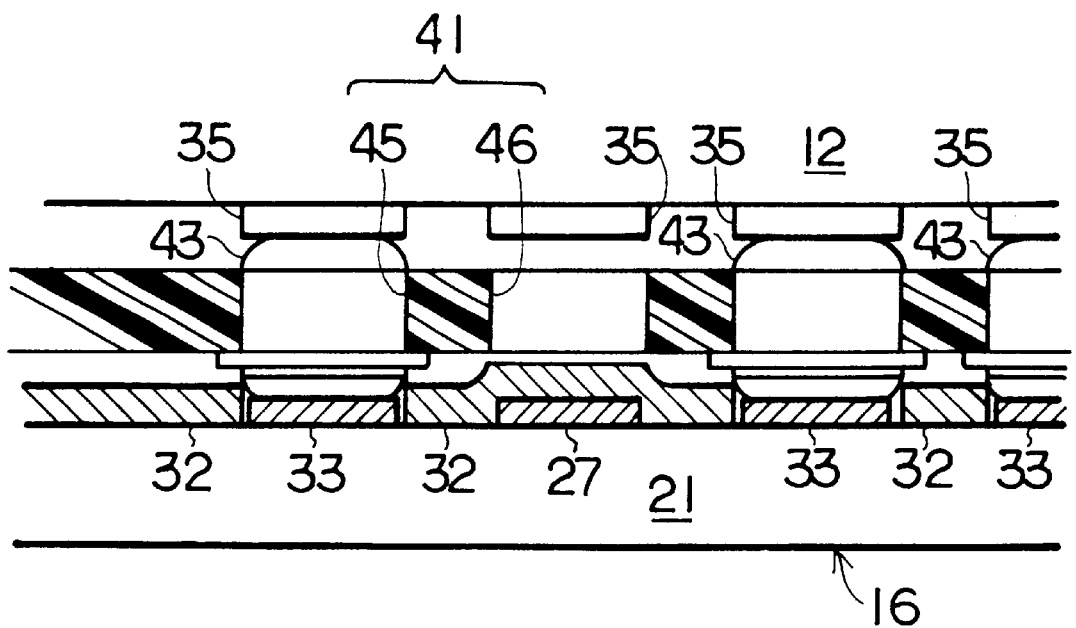
FIG. 8 is an enlarged sectional view schematically illustrating a connecting mechanism according to another specific embodiment.

The anisotropic conductive rubber plate 44 in this manner allows designation or selection of the operative through holes 45 receiving the detachable conductive pins 43, as shown in FIG. 8, for example. Such operative through holes 45 should be aligned with the conductive pattern 27, namely, the contact pads 33 exposed at the breaks of the protection film pattern 32 when the anisotropic conductive rubber plate 44 is superposed on the flexible printed circuit board 16. No detachable conductive pins 43 are inserted in the through holes, namely, the inoperative or additional through holes 46 opposed to the surface of the protection film pattern 32. Such selection of the operative through holes 45 serves to reliably prevent the detachable conductive pins 43 from colliding against the protection film pattern 32 when the anisotropic conductive rubber plate 44 is superposed on the surface of the flexible printed circuit board 16. The detachable conductive pins 43 in the operative through holes 45 are reliably allowed to first contact the contact pads 33 in the conductive pattern 27. Electric connection can reliably be established between the contact pads 33 and the detachable conductive pins 43. Note that it is harmless to locate the inoperative through holes 46 at the aforementioned positions opposed to the protection film pattern 32, at positions aligned with the contact pads 33, 35 which are not expected to be connected, at positions opposed to the conductive pattern 27, and the like.

Since the detachable conductive pins 43 are selectively inserted into the through holes 41 uniformly arranged in the elastic insulation plate 42, the contact pads 33, 35 may be arranged at any locations corresponding to the through holes 41. Any combination of the through holes 41 can be accepted. The anisotropic conductive rubber plate 44 can be employed to connect the contact pads 33, 35 in various arrangement to each other without redesigning the elastic insulation plate 42 and the detachable conductive pin 43. In addition, since the detachable conductive pins 43 can easily be relocated from the operative through hole 45 to the inoperative through hole 46, the anisotropic conductive rubber plate 44 is allowed to easily change the pattern of electric connection between the first and second printed circuit boards, namely, the back panel 12 and the flexible printed circuit board 16. On the contrary, all of through holes 41 may be designed to receive the detachable conductive pins 43 from the beginning.

In general, the flexible printed circuit board 16 is not allowed to comprise a large number of insulation layers alternated with conductive layers, as compared with a rigid printed circuit board such as the back panel 12. An increased number of layers are supposed to cause not only the insulation layer or film to peel off the conductive layer but also circuit or wiring patterns within the conductive layer to break down at a higher probability when the flexible printed circuit board 16 is bent or folded. Less layers tend to result in employment of a printed circuit or wiring pattern extending on the exposed surface of the substrate 21. The connecting mechanism according to the present invention is in particular very useful to a printed circuit board comprising less or limited layers.

What is claimed is:

1. An electronic apparatus comprising:
    a first printed circuit board having a conductive pattern over a surface;
    a second printed circuit board having a conductive member over a surface, which surface is opposed to the surface of the first printed circuit board conductive pattern formed on a surface of a substrate in at least one of the first and second printed circuit boards;

a protection film formed on the surface of the first printed circuit board substrate so as to cover over at least partly the conductive pattern;

an elastic conductive member interposed between the opposed surfaces of the first and second printed circuit boards, wherein said elastic conductive member comprises:

an elastic insulation plate defining through holes; and a conductive pin selectively received in a said through hole so as to electrically connect the conductive member on the second printed circuit board to the conductive pattern at a break of the protection film.

2. The electronic apparatus according to claim 1, further comprising a conductive contact protruding from a surface of the conductive pattern so as to reach a level above a surface of the protection film.

3. The electronic apparatus printed circuit board according to claim 2, wherein the conductive contact comprises a contact pad shaped in the conductive pattern, and a solder bump formed on a surface of the contact pad.

4. The electronic apparatus according to claim 1, wherein the elastic conductive member comprises a conductive pin is arranged only at a location opposed to the conductive pattern at the a break of the protection film.

5. The electronic apparatus according to claim 1, wherein the through holes comprise elastic conductive member comprises an elastic insulation plate defining an operative through hole for receiving the conductive pin and an additional through hole of a diameter identical to that of the operative through hole.

6. An electronic apparatus comprising:

a first printed circuit board having a conductive pattern over a surface;

a second printed circuit board having a conductive member over a surface, which surface is opposed the surface of the first printed circuit board;

a protection film formed on the surface of the first printed circuit board so as to cover over at least partly the conductive pattern;

an elastic conductive member interposed between the opposed surfaces of the first and second printed circuit boards, wherein said elastic conductive member comprises;

an elastic insulation plate; and brass wires penetrating through the elastic insulation plate, some of the brass wires connecting the elastic conductive member on the second printed circuit board to the conductive pattern at a break of the protection film.

7. The electronic apparatus according to claim 6, further comprising a conductive contact protruding from a surface of the conductive pattern so as to reach a level above a surface of the protection film.

8. The electronic apparatus according to claim 7, wherein the conductive contact comprises a contact pad shaped in the conductive pattern, and a solder bump formed on a surface of the contact pad.

* * * * *